United States Patent [19]

Brown et al.

[11] 3,978,517

[45] Aug. 31, 1976

[54] TITANIUM-SILVER-PALLADIUM METALLIZATION SYSTEM AND PROCESS THEREFOR

[75] Inventors: Gene Edgar Brown, Rolling Meadows, Ill.; Richard Leslie Greeson, Scottsdale, Ariz.

[73] Assignee: Motorola, Inc., Chicago, Ill.

[22] Filed: Apr. 4, 1975

[21] Appl. No.: 565,166

[52] U.S. Cl. .................................. 357/71; 357/13; 357/65; 357/68; 357/73; 29/588
[51] Int. Cl.² ................. H01L 23/48; H01L 29/46; H01L 29/54; H01L 29/62
[58] Field of Search ................... 357/71, 68, 65, 13, 357/73; 29/588

[56] References Cited

UNITED STATES PATENTS

| | | | |
|---|---|---|---|
| 3,261,075 | 7/1966 | Carman | 357/71 |
| 3,386,894 | 6/1968 | Steppat | 357/71 |
| 3,567,508 | 3/1971 | Cox et al. | 357/71 |
| 3,686,080 | 8/1972 | Banfield et al. | 357/71 |

*Primary Examiner*—Andrew J. James
*Attorney, Agent, or Firm*—Lowell E. Clark; Harry M. Weiss

[57] ABSTRACT

An improved metallization system comprising successive layers of titanium, silver and palladium is disclosed. The system is of particular usefulness in the semiconductor field.

1 Claim, 4 Drawing Figures

TITANIUM-SILVER-PALLADIUM METALLIZATION SYSTEM AND PROCESS THEREFOR

BACKGROUND OF THE INVENTION

This invention relates to an improved metallization system for substrate materials and to a process therefor. More particularly, this invention relates to a metallization system for semiconductor materials.

Semiconductors generally consist of a single crystal element of silicon which has an internal PN junction and has plated metal contacts at surfaces parallel to the PN junction. Electrical connectors are soldered to the metal coating and often one of the connectors is part of the housing which forms an enclosure for the semiconductor device. Metal coatings have been required because solder materials do not wet silicon well enough to permit soldering the connectors directly to the silicon material.

One approach used in the prior art involves an elaborate wet chemical process in which heated wafers are dipped into a nickel plating bath, then a second nickel coating is applied over the first one and then gold plated over the nickel, all by immersing in plating baths with suitable rinsing and drying procedures carried out between the plating steps. In addition to the manufacturing costs inherent in this process, the plating baths often contain contaminants which can degrade the electrical characteristics of the coated devices.

The metallization system chromium-silver-gold is widely used in the semiconductor industry but is characterized by a variety of drawbacks. Thus, there is a certain lack of reproducibility when evaporated onto silicon substrates by conventional evaporation equipment. The silver does not bond strongly with most materials and will peel from the chromium if the chromium becomes oxidized or an adequate interphase is not formed during the evaporation process. Furthermore, at high temperatures e.g., 700°C or above, gold migrates into silicon therefore requiring a thick layer of chromium to function as a barrier.

SUMMARY OF THE INVENTION

This invention is directed to a substrate metallized with successive layers of titanium-silver-palladium. More particularly, it relates to a semiconductor substrate having disposed thereon successive layers of titanium, silver and palladium. The invention also relates to a method for the vacuum evaporation of a titanium-silver-palladium metallization system on a substrate comprising evacuating a closed system; evaporating titanium to form a layer of titanium on the substrate; evaporating silver to form a layer of silver on top of the titanium layer; and evaporating palladium to form a layer of palladium on top of the silver layer.

It has been found that the metallization system of this invention contains strong, ductile intermetallic and metallic-to-substrate bonds which are not susceptible to peeling. Furthermore, the system is stable at elevated temperatures, allowing a thin layer of titanium which presents design advantages. It will be apparent that the ability to employ thin layers of metal and to obviate the use of gold offer economic advantages in metallization systems.

DETAILED DESCRIPTION OF THE INVENTION

Figure 1:
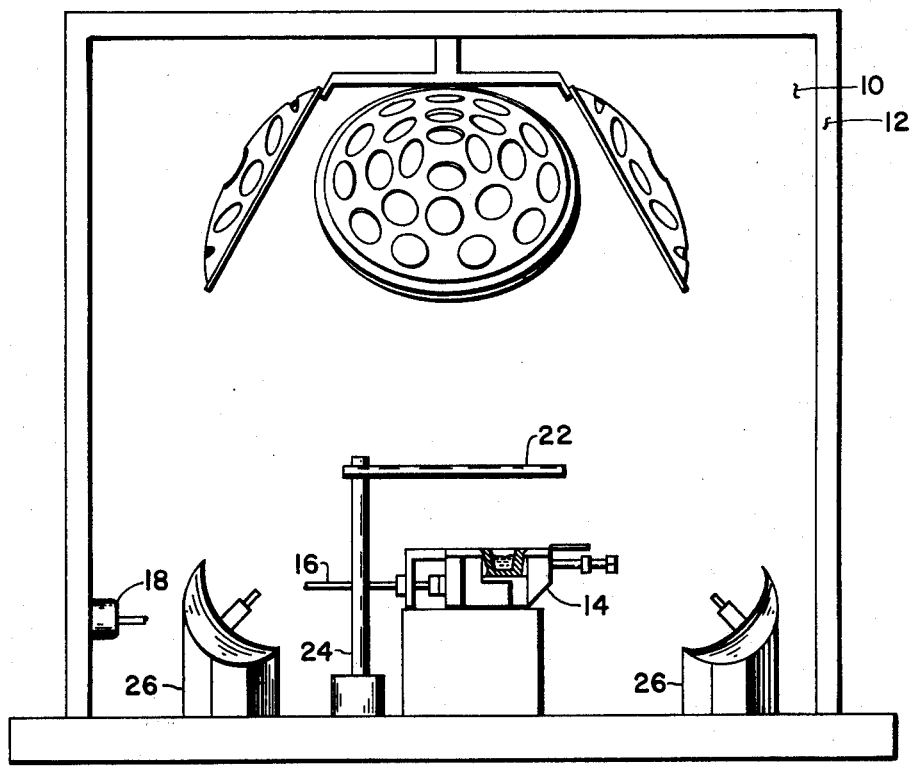
FIG. 1 is a side view of an evaporation structure used in the application of the metallization system of this invention.

Referring to FIG. 1, there is shown an evaporation structure for the titanium-silver-palladium metallization system of this invention. The basic structure as shown contains a vacuum evaporation system 10 within a housing 12. The structure includes an electron beam heated evaporation source 14 (enlarged in FIG. 3) driven by shaft 16 and motor drive 18. At the top of the structure is shown the substrate holders 20 in which silicon wafers are placed. In this view, the silicon wafers are not in place in the substrate holders 20. Separating the evaporation sources from the substrates during initial parts of the evaporation is shutter 22 which is actuated by shutter drive 24. An additional device, not shown, allows the operator of the evaporation system to open the shutter 22 from outside the house 12. Quartz heaters 26 are used to heat the silicon wafers.

Figure 2:
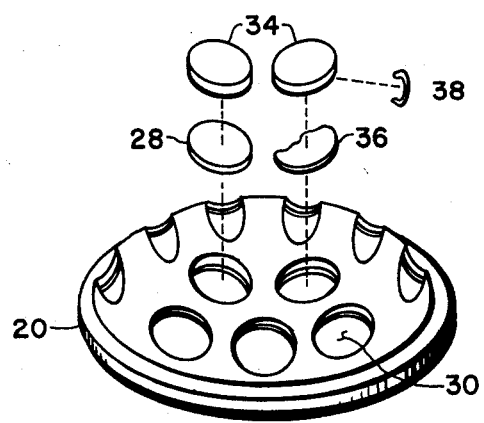
FIG. 2 is an exploded isometric view of the carrier for handling silicon wafers which fits into the structure of FIG. 1.

Silicon wafers 28 to be metallized are loaded into substrate holder 20 as shown in FIG. 2. Holes 30 in the substrate holder are provided which have a step 32 upon which a silicon wafer 28 may rest. A quartz disc 34 is then placed on top of the silicon wafer 28. For very small pieces of wafer 36, as in the badly broken wafer shown in FIG. 2, a spring clip 38 is affixed to the quartz disc 34 and the spring bears against the piece of wafer 36 holding it against the quartz 34 and this, as an assembly, is loaded into the substrate holder 20.

Figure 3:
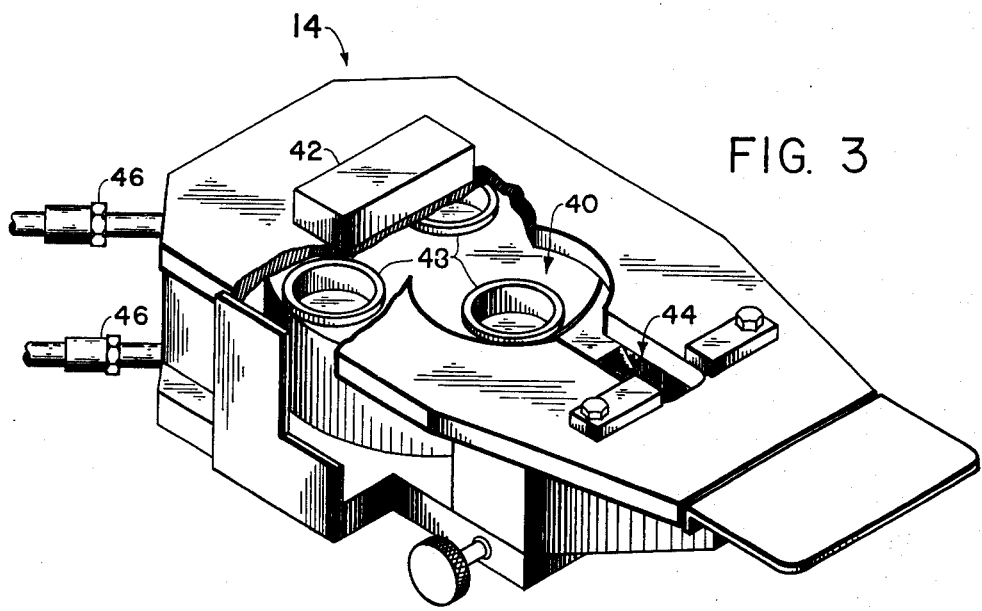
FIG. 3 is an enlarged view of the evaporation source used in FIG. 1.

Referring to FIG. 3, evaporation source 14 has an opening 40 over a crucible insert, a magnet 42 for deflecting an electron beam coming from opening 44 and water cooling lines 46. Such evaporation sources are commercially available; a typical device is the Turret Source TIH-270 sold by Airco Temescal, Berkeley, California. Three crucibles 48 rotate within evaporation source 14. Crucibles 48 are preferably copper but graphite or other crucible materials can be employed. Conveniently, three crucibles are used inasmuch as three metals are being evaporated, but sources containing various numbers of crucibles can be employed.

The invention will now be described in detail in terms of forming a titanium-silver-palladium metallization on a silicon substrate. Substrate holders 20 are loaded and placed within housing 12 as shown in FIG. 1. The housing is evacuated down to a pressure in the range of $10^{-6}$ to $10^{-8}$ torr. One crucible is filled with titanium pellets, one with silver pellets and one with palladium wire or pellets. The crucibles are rotated so that the crucible containing the titanium is directly under the opening 40 in the evaporation source. Quartz heaters 26 are turned on and the substrates are then heated to a temperature of 150°–250° C. for several minutes in order to clean the substrates and insure optimum adhesion of the titanium thereto. The electron beam gun (not shown) in evaporation source 14 is turned on and the titanium is then heated and evaporated to remove the volatile and gaseous impurities. Then shutter 22 is opened and the titanium evaporated at 1200°–1250°C at a pressure of $10^{-6}$ to $10^{-8}$ torr. Preferably, a temperature of about 1230°–1240°C is employed. Evaporation is continued until a layer 600–800 A thick has been deposited. Any conventional means can be employed for determining the thickness of the layer but preferably direct read out of a calibrated monitor is used. Shutter 22 is then moved back in position over opening 40, the crucible insert is rotated until the crucible containing the silver is under the opening, and heating initiated for silver. Silver is generally evaporated at 600°–700°C, preferably at 615°–620°C. While the quartz heaters are generally turned off after the titanium evaporation step, the surface of the substrates should remain heated to at least 200°C to insure optimum adhesion of silver to the titanium. Evaporation of the silver is continued until a layer 6000–8000 A has been deposited, then the shutter is put back in place over opening 40, the crucibles rotated until the crucible containing palladium is exposed, the palladium heated, the shutter removed and evaporation initiated. Palladium is evaporated at 950°–1050°C, and preferably at 990°–1000°C until a layer 1000–1500 A has ben deposited over the silver. Again, the layer of silver should be at a temperature of at least 200°C during deposition of the palladium. The system is then bled until atmospheric pressure is obtained.

While the above described evaporation system is preferred in the practice of this invention, it should be noted that the palladium need not be evaporated in a vacuum. If desired, it can be applied by chemical or electrochemical techniques. However, due to sputtering and oxidation problems, the titanium and slver should be applied by evaporation.

While the invention has broad applicability to most substrates, it is particularly suitable for forming metallization layers on semiconductor substrates. In this area, it has been found to be particularly suited for the manufacture of Zener diodes of the glass encapsulated, double slug construction types. These devices generally require sealing temperatures of 700°C or higher in order to encapsulate the devices. At such temperatures the conventional chromium-silver-gold system forms brittle intermetallics that render it undesirable for use on these devices. The system of this invention results in surprisingly high quality metallization that is stable to such elevated temperatures.

Thus, referring to FIG. 5, there is shown an NPZ Zener diode 50 having an N-type silicon region 52 and a P+ region 54. In accordance with this invention, layers of titanium 56, silver 58 and palladium 60 are provided over the bottom of the diode and over the contact region of the top surface which had been passivated with silicon dioxide layer 64 prior to metallization. While the entire bottom surface of the device is metallized, the metallization does not extend over the entire top surface in order to prevent shorting out of the device.

Metallization on these devices can be conveniently carried out in the apparatus of FIG. 1. Thus, the devices are loaded in the substrate holder 20 with the window exposed towards the source. The entire top surface is then metallized over layer 62. Then the devices are removed from the apparatus and conventional patterning and etching carried out to remove the metallization from the areas near the sides of the device. Subsequently, the devices are re-loaded in substrate holder 20 with the back surfaces exposed and the metallization carried out in accordance with this invention.

Figure 4:
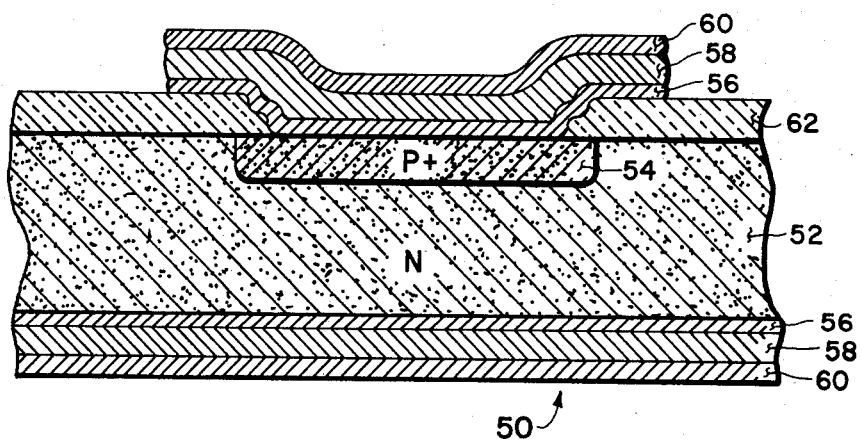
FIG. 4 is a cross sectional view of a planar Zener diode having the metallization system of this invention.

While FIG. 4 indicates metallization on both the front and back surfaces of the device, the metallization system of this invention could be applied to only one of the surfaces and conventional systems employed on the alternate surface. However, it will be apparent that it will be most advantageous to use this invention to provide the total device.

Other types of devices are also amenable to the metallization system of this invention. For example, PPZ diodes which are similarly depicted in FIG. 4 but comprise a P type substrate with an N+ region disposed therein can be metallized. Other types of devices such as alloy planar diffused Zener diodes, and NPZ devices having no alloy region also lend themselves to the practice of this invention.

Although the invention has been described in connection with certain preferred embodiments, it is not intended that the invention be limited thereto. Thus, it is intended that the invention cover all alternatives, arrangements, equivalents, and embodiments as may be included in the scope of the following claims.

What is claimed is:

1. A glass encapsulated double-plug diode comprising a semiconductor substrate, said substrate having disposed thereon successive layers of titanium, silver and palladium.

* * * * *